(12) United States Patent
Fort

(10) Patent No.: US 9,148,736 B2
(45) Date of Patent: Sep. 29, 2015

(54) REDUCED POWER USAGE FOR A HEARING PROSTHESIS HAVING TRANSCUTANEOUS POWER AND DATA TRANSFER

(71) Applicant: Cochlear Limited, Macquarie University (AU)

(72) Inventor: Andrew Fort, Leuven (BE)

(73) Assignee: Cochlear Limited, Macquarie University (AU)

( * ) Notice: Subject to any disclaimer, the term of this patent is extended or adjusted under 35 U.S.C. 154(b) by 0 days.

(21) Appl. No.: 14/011,259

(22) Filed: Aug. 27, 2013

(65) Prior Publication Data

US 2014/0270286 A1 Sep. 18, 2014

Related U.S. Application Data

(60) Provisional application No. 61/788,259, filed on Mar. 15, 2013.

(51) Int. Cl.
*H04B 15/00* (2006.01)
*H04R 25/00* (2006.01)
*H03G 11/00* (2006.01)

(52) U.S. Cl.
CPC ............ *H04R 25/554* (2013.01); *H04R 25/505* (2013.01); *H03G 11/00* (2013.01); *H04R 2460/03* (2013.01)

(58) Field of Classification Search
USPC ........................... 381/94.8, 317, 71.1
See application file for complete search history.

(56) References Cited

U.S. PATENT DOCUMENTS 6,795,559 B1 * 9/2004 Taura et al. ................... 381/94.8
2002/0172374 A1 * 11/2002 Bizjak ......................... 381/71.14

* cited by examiner

*Primary Examiner* — Davetta W Goins
*Assistant Examiner* — Amir Etesam
(74) *Attorney, Agent, or Firm* — McDonnell Boehnen Hulbert & Berghoff LLP

(57) ABSTRACT

Disclosed herein are methods and apparatuses designed to reduce the power usage of a hearing prosthesis. To reduce the power usage of the prosthesis, an external portion may transmit a signal having a plurality of transmission parameters to an internal component. The external portion receives an indication of an implant power parameter associated with the plurality of transmission parameters. After receiving the indication, the external portion adjusts at least one transmission parameter. After adjusting at least one parameter, the external portion transmits a signal to the internal component based on the adjusted parameters and responsively receives an indication of an implant power parameter associated with the adjusted parameters. Based on the received indication of the implant power parameter for a plurality of transmissions, the external portion determines a preferred set of transmission parameters. Finally, the external portion is operated based on the preferred set of transmission parameters.

26 Claims, 4 Drawing Sheets

REDUCED POWER USAGE FOR A HEARING PROSTHESIS HAVING TRANSCUTANEOUS POWER AND DATA TRANSFER

REFERENCE TO RELATED APPLICATIONS

The present application claims priority to U.S. Provisional Patent Application Ser. No. 61/788,259, filed in the United States Patent and Trademark Office on Mar. 15, 2013, the entire contents of which is incorporated herein by reference.

BACKGROUND

Various types of hearing prostheses may provide people having different types of hearing loss with the ability to perceive sound. Hearing loss may be conductive, sensorineural, or some combination of both conductive and sensorineural. Conductive hearing loss typically results from a dysfunction in any of the mechanisms that ordinarily conduct sound waves through the outer ear, the eardrum, or the bones of the middle ear. Sensorineural hearing loss typically results from a dysfunction in the inner ear, including the cochlea, where sound vibrations are converted into neural signals, or any other part of the ear, auditory nerve, or brain that may process the neural signals.

People with some forms of conductive hearing loss may benefit from hearing prostheses, such as acoustic hearing aids or vibration-based hearing aids. An acoustic hearing aid typically includes a small microphone to detect sound, an amplifier to amplify certain portions of the detected sound, and a small speaker to transmit the amplified sound into the person's ear. Vibration-based hearing aids typically include a small microphone to detect sound, and a vibration mechanism to apply vibrations corresponding to the detected sound to a person's bone, thereby causing vibrations in the person's inner ear, thus bypassing the person's auditory canal and middle ear. Vibration-based hearing aids include bone-anchored hearing aids, direct acoustic cochlear devices, or other vibration-based devices.

Persons with certain forms of sensorineural hearing loss may benefit from cochlear implants, auditory brainstem implants, or other prostheses. For example, cochlear implants can provide a person having sensorineural hearing loss with the ability to perceive sound by stimulating the person's auditory nerve via an array of electrodes implanted in the person's cochlea. A component of the cochlear implant, such as a microphone, detects sound waves. The sound waves are converted into a series of electrical stimulation signals that are delivered to the implant recipient's cochlea via the array of electrodes. Auditory brainstem implants can use technology similar to cochlear implants, but instead of applying electrical stimulation to a person's cochlea, auditory brainstem implants apply electrical stimulation directly to a person's brain stem, bypassing the cochlea altogether. Electrically stimulating auditory nerves in a cochlea with a cochlear implant or electrically stimulating a brainstem may enable persons with sensorineural hearing loss to perceive sound. Further, some persons may benefit from hearing prostheses that combine one or more characteristics of acoustic hearing aids, vibration-based hearing devices, cochlear implants, auditory brainstem implants, or other prostheses to enable the person to perceive sound.

In some hearing prosthesis systems, a prosthesis has a power source located in the external portion. For example, the external portion may contain a battery. The internal portion may also contain a power source, such as a battery or capacitor. The external portion may couple power wirelessly to the internal portion to charge its power source.

SUMMARY

Disclosed herein are methods and apparatuses that adjust transmission parameters for communication between the external and internal portions of a hearing prosthesis. The external portion transmits a signal having a plurality of transmission parameters to an internal component. The external portion responsively receives an indication of an implant power parameter associated with the plurality of transmission parameters. After receiving an indication of an implant power parameter, the external portion adjusts a first transmission parameter from the plurality of transmission parameters or adjusts a second transmission parameter from the plurality of transmission parameters. After adjusting at least one parameter, the external portion transmits a signal to the internal component based on the adjusted parameters and responsively receives an indication of an implant power parameter associated with the adjusted parameters. The external portion iteratively performs the adjusting, transmitting, and receiving. Based on the received indication of the implant power parameter for a plurality of transmissions, the external portion determines a preferred set of transmission parameters. Finally, the external portion transmits a signal to the internal portion during operation of the prosthesis based on the preferred set of transmission parameters. By so adjusting the transmission parameters, power usage of the external portion is optimized (e.g. minimized).

The first transmission parameter that the external portion adjusts is a power level. In some embodiments, the processor controls the power level through the duty-cycle of the transmissions. The duty-cycle is adjusted by varying a pulse width (i.e. pulse-width modulation). The second transmission parameter that the processor adjusts is a frame length. The external prosthesis adjusts the transmission parameters by iteratively adjusting the transmission parameters from a predefined set of values. Additionally, the external portion stores at least one preferred set of transmission parameters. The preferred set of transmission parameters includes combinations of the first transmission parameter and the second transmission parameter that have an associated external portion power usage less than a threshold power usage. Additionally, the preferred set of transmission parameters includes combinations of the first transmission parameter and the second transmission parameter corresponding to the implant power parameter being greater than a threshold implant power parameter. Further, in some embodiments, the external portion performs these methods after receiving an indication of system initiation.

DETAILED DESCRIPTION

For illustration purposes, some of the examples below generally reference cochlear implants. However, many systems and methods may be equally applicable to other types of hearing prostheses. Certain aspects of the disclosed systems and methods could be applicable to any type of hearing prosthesis, now known or later developed. Further, some of the disclosed methods can be applied to other devices that are not necessarily hearing prostheses.

Figure 1A:
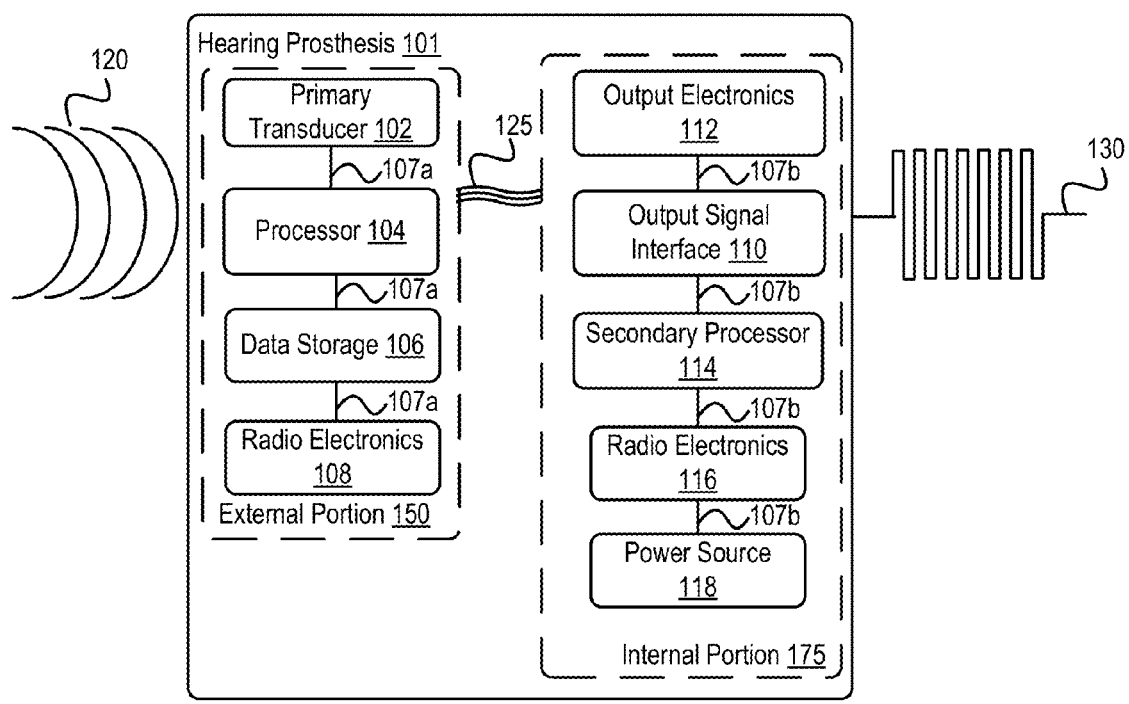
FIG. 1A is a simplified block diagram illustrating an example of a hearing prosthesis.

FIG. 1A is a simplified block diagram illustrating an example of a hearing prosthesis 101. The hearing prosthesis 101 may be a cochlear implant, an acoustic hearing aid, a bone-anchored hearing prosthesis or other vibration-based hearing prosthesis, a direct acoustic stimulation device, an auditory brain stem implant, or any other type of hearing prosthesis having an internal portion configured to receive and process at least one signal from an external portion of the prosthesis.

The hearing prosthesis 101 includes an external portion 150 and an internal portion 175. The external portion 150 includes a primary transducer 102, data storage 106, radio electronics 108, and a processor 104, all of which are connected directly or indirectly via circuitry 107a. The internal portion 175 includes an output signal interface 110, output electronics 112, a secondary processor 114, radio electronics 116, and power source 118, all of which connect directly or indirectly via circuitry 107b. In other embodiments, the hearing prosthesis 101 may have additional or fewer components than the prosthesis shown in FIG. 1. For example, in some embodiments, the external portion 150 includes a secondary transducer. Additionally, the components may be arranged differently than shown in FIG. 1. For example, depending on the type and design of the hearing prosthesis, the illustrated components are enclosed within a single operational unit or distributed across multiple operational units (e.g., multiple external units and an internal unit).

In embodiments where the hearing prosthesis 101 is a cochlear implant, the hearing prosthesis comprises an external portion 150 generally worn outside the body and an internal portion 175 generally implanted within the body. The external portion 150 is coupled to the internal portion 175 via an inductive coupling pathway 125. In some embodiments, the inductive coupling pathway 125 is formed by a coupling between the radio electronics 108 of the external portion 150 and the radio electronics 116 of the internal portion 175. The primary transducer 102 is preferably a microphone that receives and converts acoustic signals 120 (sound waves) into corresponding electrical signals, which the processor 104 analyzes and encodes into a group of electrical stimulation signals 130 for application to an implant recipient's cochlea via an output signal interface 110 communicatively connected to output electronics 112.

The internal portion 175 has a power source 118, such as a battery or capacitor, to provide energy to the electronic components housed within the internal portion 175. In some embodiments, the external portion 150 is used to inductively charge the power source 118 in the internal portion 175 via a wireless signal. In other embodiments, the external portion 150 additionally or alternatively provides power to operate the components of the internal portion 175. The power source 118 in the internal portion 175 may also be used to regulate a voltage within the internal portion 175. For example, the external portion 150 may wireless couple power to the internal portion 175. The power source 118 of the internal portion 175 receives this power and provides a stable voltage to operate the electronics of the internal portion 175. Thus, in such embodiments, the power source 118 of the internal portion 175 does not necessarily drain its own power reserve during operation, but rather regulates the voltage supply to the electronic components in the internal portion 175.

In some embodiments, the power source 118 in the internal portion 175 is used as a backup power source when the external portion 150 is decoupled from the internal portion 175 or the external portion 150 runs out of power, for example. In this example embodiment, a different power source that is part of the external portion 150 is the primary power source for the hearing prosthesis. The power source 118 in the internal portion 175 is only used as a backup source of power. Thus, during normal operation of the prosthesis, the battery on the external portion 150 both (i) powers the internal portion 175 and external portion 150 and (ii) charges the power source 118 on the internal portion 175. The power source 118 in the internal portion 175 enables the prosthesis 101 to provide some functionality when the external portion 150 is not coupled to the prosthesis recipient.

In some embodiments, the processor 104 is located in another separate external portion (not shown). For example, the processor 104 may be located in a standard computer, a laptop computer, a tablet computing device, a mobile device such as a cellular phone, or a custom computing device. The primary transducer 102 may wirelessly communicate signals to the processor 104. In some embodiments, the processing functions of processor 104 are split across multiple processing units. Some of the processing units may be located in hearing prosthesis 101 and other processing units may be located in an external computing device. Additionally, the external portion 150 contains radio electronics 108. The radio electronics 108 of the external portion 150 allow the external portion 150 to communicate with the internal radio electronics 116 of the internal portion 175.

The external portion may also include a data storage 106, which generally includes any suitable volatile and/or non-volatile storage component(s). Further, the data storage 106 may include computer-readable program instructions and perhaps additional data. In some embodiments, the data storage 106 stores an amplitude response, a phase response, and recipient-specific parameters associated with the hearing prosthesis 101. Additionally, the data storage 106 stores a set of signal processing modes and associated parameters for each respective signal processing mode. In other embodiments, the data storage 106 also includes instructions used to perform at least part of the disclosed methods and algorithms, such as method 200 described with respect to FIG. 2. Further, the data storage 106 may be configured with instructions that cause the processor 104 to execute functions relating to any of the modules disclosed herein.

For a cochlear implant, the output electronics 112 take the form of an array of electrodes. Individual sets of electrodes in the array of electrodes are grouped into stimulation channels. Each stimulation channel has at least one working electrode (current source) and at least one reference electrode (current sink), which may be shared across the stimulation channels. During the operation of the prosthesis, the cochlear implant applies electrical stimulation signals to a recipient's cochlea via the stimulation channels. It is these stimulation signals that cause the recipient to experience sound sensations corresponding to the sound waves received by the primary transducer 102 and encoded by the processor 104.

Figure 1B:
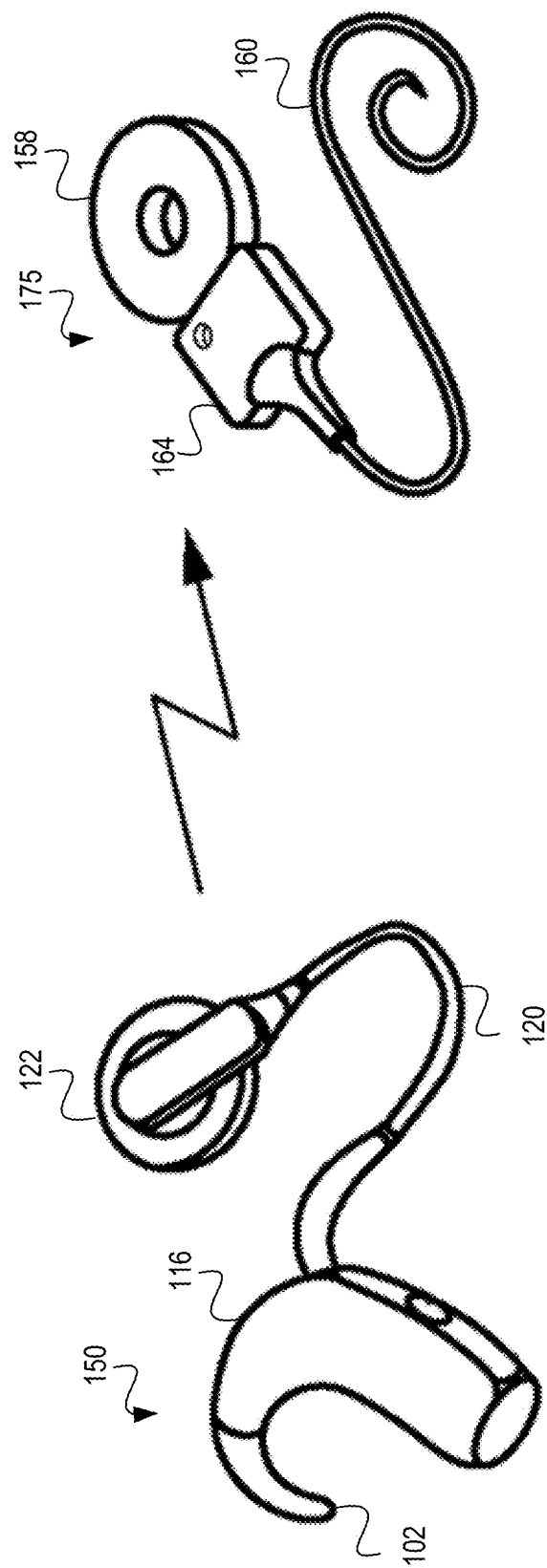
FIG. 1B is a simplified conceptual diagram illustrating an example of an external portion of a cochlear implant coupled to an internal portion of the cochlear implant.

FIG. 1B is a simplified conceptual diagram illustrating an example of an external portion 150 of a cochlear implant coupled to the internal portion 175 of the cochlear implant. The external portion 150 and internal portion 175 are shown at a significant distance from one another for improved clarity in illustration. The external portion 150 is directly attached to the body of a recipient and the internal portion 175 is implanted in the recipient. The external portion 150 includes a housing 116 that has a primary transducer 102 for detecting sound, a sound processing unit (104 of FIG. 1A), an external coil 122 including a radio frequency modulator and a coil driver, and a power source. External coil 122 is connected to a transmitter unit and the housing 116 by a cable 120.

The housing 116 is shaped so that it can be worn and held behind the ear. The processing unit in the housing 116 processes the output of the transducer 102 and generates coded signals that are provided to the external coil 122 via the modulator and the coil driver.

The internal portion 175 comprises a housing 164. Located within the housing 164 are a receiver unit, a stimulator unit, an external portion sensor, a power source, and a secondary processor (114 of FIG. 1A). Attached to the housing 164 are an internal coil 158 and an electrode assembly 160 that can be inserted in the cochlea. In some embodiments, magnets are secured to the internal (receiving) coil 158 and the external (transmitting) coil 122 so that the external coil 122 can be positioned and secured via the magnets outside the recipient's head to be aligned with the implanted internal coil 158 inside the recipient's head. The internal coil 158 receives power and data from the external coil 122. The electrode assembly 160 includes a cable that extends from the implanted housing 164 to the cochlea and terminates in the array of electrodes. Transmitted signals received from the internal coil 158 are processed by the receiver unit in the housing 164 and are provided to the stimulator unit in the housing 164.

The internal portion 175 has a power source, such as a battery or capacitor, to provide energy to the electronic components housed within the internal portion 175. As previously discussed with respect to FIG. 1A, in some embodiments, the external portion 150 is able to inductively charge the power source within the internal portion 175. In an example embodiment, a power source that is part of the external portion 150 is the primary power source for the hearing prosthesis. In this example, the power source within the internal portion 175 is only used as a backup source of power. The battery in the internal portion 175 is used as a backup power source when either the external portion 150 runs out of power or when the external portion 150 is decoupled from the internal portion 175.

The external coil 122 is held in place and aligned with the implanted internal coil via the magnets described above. In one embodiment, the external coil 122 is configured to transmit electrical signals to the internal coil via a radio frequency (RF) link. In some embodiments, the external coil 122 is also configured to transmit electrical signals to the internal coil via a magnetic (or inductive) coupling.

The power transmission settings of a hearing prosthesis are initially set in a clinic. However, outside the clinic, use conditions may make the power transmission parameters less than optimal for some situations. For example, a recipient's body may change (e.g. thicker skin, thinner fat layer, etc.) and responsively cause the transmission parameters to become less than optimal. Additionally, sometimes the recipient connects the external portion of the prosthesis in a slightly different manner than how it was connected in the clinical setting. There are also other possible ways that the transmission parameters become less optimal. The change in the transmission parameters results in either (i) an excessive amount of power being used to transmit signals to the internal portion or (ii) not enough power transmitted for the internal portion to function correctly. Method 200, as disclosed herein with respect to FIG. 2, functions to adjust transmission parameters in situ. In some embodiments, method 200 is performed as part of an initialization routine each time a recipient attaches the external portion of the prosthesis. In other embodiments, method 200 is performed periodically.

Figure 2:
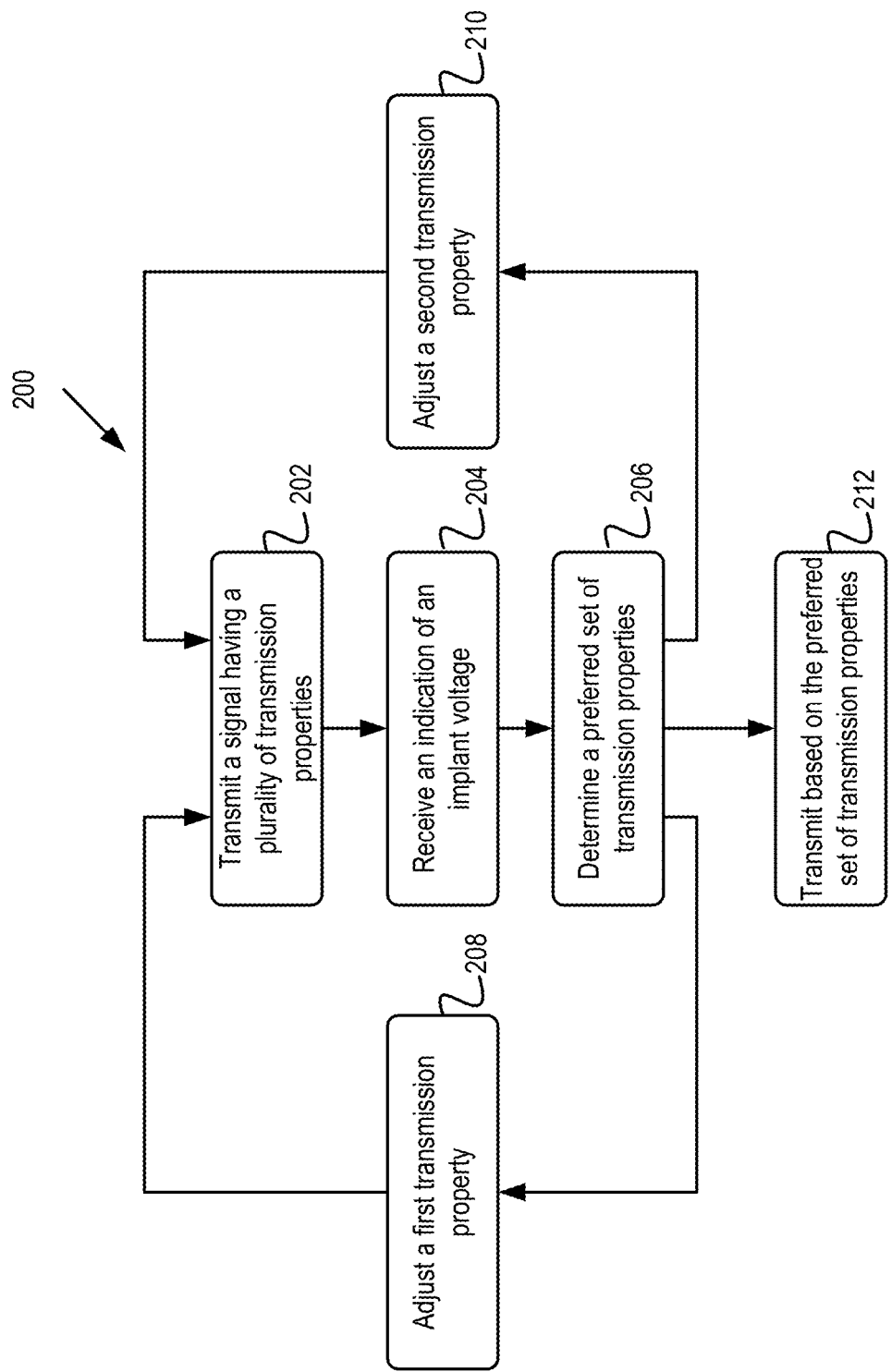
FIG. 2 is a flowchart illustrating an example method for optimizing the power used by a hearing prosthesis.

FIG. 2 is a flowchart illustrating an example method 200 for optimizing the power used by a hearing prosthesis. In some embodiments, processor 104 of FIG. 1 performs one or more steps of method 200, in combination with radio electronics 108 of FIG. 1. More particularly, method 200 optimizes the radio communication between the external portion 150 and the internal portion 175 of a hearing prosthesis (in this example, a cochlear implant).

Method 200 begins at block 202, where a signal having a plurality of transmission parameters is transmitted from the external portion 150 (of FIG. 1) to the internal portion 175 (of FIG. 1). A processor located in the external portion of a cochlear implant can control the transmission that is sent by the radio electronics 108 of the implant.

In some embodiments, the transmission of block 202 is sent in response to an external portion of a cochlear implant being moved into proximity of the internal portion, such as when a prosthesis recipient first wakes up in the morning and affixes the external portion. In some embodiments, the transmission at block 202 is part of an initialization routine for the hearing prosthesis. However, the transmission at block 202 may be sent in other situations as well. For example, in some embodiments, the transmission at block 202 is performed periodically during the operation of the hearing prosthesis.

In various embodiments, the transmission includes both a data signal and a power signal. The power portion of the transmission is a radio signal that the internal portion 175 rectifies into a voltage. The rectified voltage charges either a battery or capacitor that powers components in the internal portion 175. Additionally, the transmission communicates data to the internal portion 175. This transmitted data includes a signal representing incoming audio, that the internal portion 175 uses to create a stimulation for the prosthesis recipient. In some embodiments, the data includes a dedicated audio signal that alerts the user that the prosthesis is undergoing initiation.

Further, the transmission at block 202 is sent with a plurality of transmission parameters. For example, the transmission is transmitted with a specific power level and a specific frame length. The specific power level relates to both (i) the strength (or magnitude) of the radio signal of the transmission and (ii) the frame length of the radio signal of the transmission. The specific frame length relates to the percentage of each frame in which power is being transmitted.

In one embodiment, the power level actually refers to the magnitude of the current going through the external coil. The higher the current going through the external coil, the larger the magnetic field the coil generates. Consequentially, the larger the magnetic field the coil generates, the more power gets coupled to the internal coil. In one example, the driver generates a 5 MHz square wave voltage signal with an associated pulse width. At full power, the pulse width results in 50% RF duty cycle and maximizes the current going through the headpiece coil. At minimum power, the pulse width of the voltage signal is set to something lower (about 10% RF duty cycle) resulting in less current going through the headpiece coil. Thus, the pulse-width of a driver square wave (its RF duty-cycle) is varied to control the RF power level. Additionally, there are potentially other ways to control the RF power level that would work with the present disclosure. For example, the voltage of the device driving current through the headpiece coil could be increased.

Data and power are transmitted from the external portion to the internal portion in frames, rather than as a continuous transmission. Each frame is transmitted subsequent to the previous frame being transmitted, with each frame being transmitted with an associated duty cycle. In one example, the period of time between consecutive frame transmissions is 1 ms. By varying the frame length, the percentage of time in which power and data are transmitted to the implant is changed. The frame length can be adjusted by appending "dummy" data to the end of the frame. If the frame length is increased to 1 ms, then the prosthesis is working with a 100% frame length (i.e. frame duty-cycle). If the frame length is decreased to 0.5 ms, then the prosthesis is working with a 50% frame duty cycle. Therefore, the frame duty cycle is the percentage of the frame that is occupied with a transmission. A 1 ms frame period is merely one example. In practice, other actual frame lengths may be used. In some embodiments, the transmission is communicated in bursts within a frame, with each frame lasting a specific amount of time. In such embodiments, the frame duty-cycle is defined as the burst time divided by the length of the frame.

In some embodiments, the first half of a frame is reserved for data and the second half is reserved for power. However, the actual amount of the reserved portion that is used for signaling may be varied, depending on the embodiment. Thus, the transmission at block 202 includes a plurality of frames, each containing data and power.

Some additional transmission parameters that may be varied include coil driver settings, power management settings, map settings, and signal processing configurations. Transmission parameters include any hearing prosthesis system parameters that affect the power usage of the prosthesis system during the transmission of a signal. For example, different combinations of hardware and software settings cause the power usage of the system to change. Further, in some embodiments, the transmission has other associated transmission parameters, such as modulation, etc. In another example, transmission parameters include the coil temperature, in which the prosthesis system measures the temperature of the coils and chooses a set of parameters to ensure that the coils do not exceed a threshold temperature. Other transmission parameters associated with the hearing prosthesis may be used within the context of the present disclosure.

In one embodiment, coil driver settings are adjusted. The voltage source in the external coil that generates the transmitted signal for delivery to the coil serves as the driver, which might include a single driver or several drivers in parallel, for example. Depending on the magnitude of the RF power level, it may be more power efficient to have a single driver sourcing all the current to the coil. However, in other instances, it is more power efficient to use a plurality of drivers in parallel, each providing a portion of the total current to the coil. Thus, in one embodiment, the number of drivers providing current is varied.

In another embodiment, there could also be different implant power management settings that are varied. For example, it might be more efficient to send the radio transmission in a way that results in low implant voltage and then turn on a voltage converter in the implant to boost that voltage. In some embodiments, a radio signal is then sent in a way that results in a high implant voltage, and then the boost converter can be turned off. The external portion of the prosthesis sends commands to the implant to test different configurations and select the one resulting configuration having the lowest power consumption.

In a still further embodiment, the number of enabled coils on either the internal or external coil is varied. Rather than using a fixed number of coil windings in the external or internal coil, a respective switch is coupled to each of multiple taps on each respective coil. When the switch is toggled, windings are added to or removed from the coil. Thus, the prosthesis system could select between (for example) a 16-turn coil or a 12-turn coil based on which resulted in the most efficient behavior for that particular recipient. Alternatively, the prosthesis might have two concentric coils with different diameters. For best efficiency, the prosthesis system could choose to use the wide diameter coil for recipients having a high skin flap thickness, and the smaller diameter coil for recipients having a low skin flap thickness.

In additional embodiments, the prosthesis varies map settings to find an efficient map setting. Map settings control things like the electrode current in different parts of the cochlea. In some situations, two or more different stimulation settings in the implant provide similar hearing performance for the recipient. During the initialization process, the prosthesis may test different candidate maps settings, in combination with other parameters, to determine what set of parameters resulted in the most efficient operation.

At block 204, an indication of an implant power parameter is received. The indication is transmitted by the internal portion 175 (of FIG. 1) and received by the external portion 150 (of FIG. 1). A processor located in the internal portion of the cochlear implant, such as secondary processor 114 of FIG. 1, can initiate the transmission from the internal portion 175. In one embodiment, the implant power parameter relates to the voltage induced inside the internal portion by the transmission from block 202. In another embodiment, the implant power parameter relates to the electrical current charging a battery (or capacitor) inside the internal portion by the transmission from block 202.

Because the internal portion is powered by a wireless signal from the external portion, the wireless signal induces a voltage inside the internal portion. Additionally, in some embodiments, the internal portion is able to monitor the level of the voltage that is induced by the external portion. In these embodiments, it is also desirable for the induced voltage to be greater than a threshold. If the voltage induced is below the threshold, the internal portion may not be able to function correctly. The induced voltage may be measured across either the battery or capacitor, for example. In another example, the prosthesis measures the current flowing into either a battery or capacitor. For example, where the battery or capacitor provides a fixed output voltage, reporting the implant voltage does not provide any useful information. By providing information about the current going to the battery or capacitor, radio link information is obtained. Additionally, other implant power parameter indications may be used, such as received radio signal strength, and other parameters that indicate signal power received by the internal component.

In one example, a prosthesis recipient may have gained (or lost) weight since the time the prosthesis was fit in a clinical setting. For example, a recipient may have received an implant as a child and since grown in the years after receiving the implant. In another example, the tissue located near the implant changes during healing after implant surgery. A weight increase (or decrease) can increase (or decrease) the thickness of a layer of fat below the skin between the internal portion and the external portion of the prosthesis. A change in skin or fat thickness may cause the implant coil to be further away from (or closer to) the headpiece coil so they are not as well coupled to each other as they were in the clinical setting, thereby causing the prosthesis to transmit signals less efficiently. Additionally, the radio signals may have other propagation-related effects from changes in the recipient's body properties.

In another example, the recipient may have not aligned the external portion in the same manner as it was aligned in the clinical setting. This misalignment causes the transmission to be altered from the original characteristics and causes the prosthesis to transmit signals less efficiently.

In the above examples for block 204, the change in operating conditions causes power to be coupled to the internal portion with a lower efficiency. In some examples, the reduced efficiency does not cause any errors with the internal portion; rather, the reduced efficiency causes an increased power usage. In other examples, the reduced efficiency causes the implant power parameter to fall below a threshold. When the implant power parameter falls below the threshold, the implant may no longer function correctly. In some embodiments, a buffer voltage may be set above the threshold voltage. By including the buffer voltage when determining the threshold voltage, risk of the internal portion operating in a mode where the implant power parameter is too low may be mitigated. When the external portion receives the indication of the implant power parameter, it records the implant power parameter and the associated transmission parameters.

At block 206, the processor determines a preferred set of transmission parameters. In some embodiments, the external portion contains a memory that stores preferred transmission parameters. The processor in the external portion can determine that a set of transmission parameters are preferred based on different criteria.

In one embodiment, a set of transmission parameters is preferred if the transmission parameters result in an implant power parameter greater than the threshold implant power parameter. In another embodiment, the processor in the external portion performs a two-step process to determine if a set of transmission parameters is preferred. First, the processor compares the implant power parameter to the threshold voltage. If the implant power parameter is below the threshold voltage, the set of transmission parameters will not be in the preferred set. If the implant power parameter is above the threshold voltage, the processor calculates an associated power usage based on the set of transmission parameters. The processor compares the associated power usage of transmitting according to the transmission parameters with a threshold power usage. If the power usage is below the threshold, then the processor determines that the set of transmission parameters are in the preferred set. The processor stores the set of transmission parameters to the memory as a preferred set. In other embodiments, different criteria are used to determine if a set of transmission parameters is preferred.

In another embodiment, only one set of transmission parameters is stored as the preferred set in block 206. The preferred set in this embodiment is the set that both (i) has an associated implant power parameter greater than the threshold voltage and (ii) a power usage that is lower than any other set of transmission parameters that have an associated implant power parameter greater than the threshold voltage. Thus, in this embodiment, only the most efficient set of transmission parameters (that supply enough power to the implant) is considered preferred.

In practice, when the external portion receives the indication of the implant power parameter from the internal portion, it compares the implant power parameter to the threshold voltage. As previously discussed, if the implant power parameter is below the threshold voltage, the implant may fail to operate correctly. Thus, if there is a potential of the internal portion failing to operate correctly, the set of transmission parameters would not be considered preferred. Additionally, the processor calculates the power usage for the set of transmission parameters. The power usage varies depending on the selected set of transmission parameters as well as the configuration of the hearing prosthesis.

For example, as discussed previously, a new positioning of the external portion or a change in the skin and fat thickness of the recipient may change the efficiency with which power can be conducted to the internal portion. Thus, the change in transmission efficiency can cause a previously preferred set of transmission parameters to be no longer preferred. However, in other situations, the change in transmission efficiency causes a set of transmission parameters that were previously not preferred to become preferred.

The memory associated with the external portion may be in the hearing prosthesis or on an external computer. The memory may include a database or table of the possible combinations of transmission parameters that are used by method 200. In some embodiments, the memory includes all permutations of combinations of the transmission parameters. However, in other embodiments, the memory contains a subset of the possible combinations of transmission parameters. Additionally, in other embodiments, the memory contains possible values for each of the transmission parameters.

In some embodiments, a processor (located either in the hearing prosthesis or on an external computer) performs calculations on the set of possible combinations of transmission parameters. Based on the calculations, a subset of the possible combinations of transmission parameters is identified as being incapable of being part of the preferred set of transmission parameters. This identified subset may be flagged as non-preferred.

Also, at block 206, the processor determines whether to next perform block 208, block 210, or block 212. As previously discussed, a memory stores a table (or database) with possible combinations of transmission parameters. At block 206, the processor in the external portion determines whether there are possible combinations for the transmission parameters that have not yet had an associated implant power parameter received.

The processor iteratively adjusts either the first or second transmission parameter, i.e., the processor chooses to perform either block 208 or block 210, depending on which parameter it decides to vary next. In some embodiments, the processor starts with the first transmission parameter at a maximum value and iteratively reduces the parameter while keeping the second parameter fixed. For example, a first transmission parameter is a power level of the radio signal and the second transmission parameter is the frame duty-cycle of the radio signal. If at block 206, the processor determines that the first transmission parameter should be adjusted, then block 208 is performed next.

However, in some instances, the second transmission parameter is adjusted first and block 210 is performed next. In yet another embodiment, both transmission parameters are adjusted at the same time, perhaps at different intervals. For example, in an iterative embodiment, all possible values of the first transmission parameter are used with a first value of the second transmission parameter. After each value of the first transmission parameter has been used, the second transmission parameter is adjusted to a second value (at block 210), and each value of the first parameter is used with the second value of the second parameter. By repeating this process, each value of the first parameter can be used with each value of the second parameter. Additionally, method 200 may be extended to use a third (or a further additional) transmission parameter as well.

At block 208, a first transmission parameter is adjusted. In a first example, a memory in the hearing prosthesis contains a table of possible values for the first parameter. Based on the current value of the first parameter, the processor in the prosthesis decreases (or increases) the value of the first parameter to the next value. In another example, the processor makes iterative adjustments to the first parameter. For example, the transmission power is lowered by 0.5 dB each time block 208 is performed. In another example, the transmission power is reduced by decreasing the RF power by 5%. Once the transmission parameter is adjusted, blocks 202, 204, and 206 may be performed again with the new adjusted first transmission parameter.

At block 210, a second transmission parameter is adjusted. For example, a memory in the hearing prosthesis contains a table of possible values for the second parameter. Based on the current value of the second parameter, the processor in the prosthesis decreases (or increases) the value of the second parameter to the next value. In another example, the processor makes iterative adjustments to the second parameter. For example, the frame length is decreased by a predetermined time interval each time block 208 is performed. Once the transmission parameter is adjusted, blocks 202, 204, and 206 are performed again with the new adjusted second transmission parameter.

At block 212, the external portion of the hearing prosthesis transmits based on the preferred set of transmission parameters. In some embodiments, block 212 is performed after all combinations of the first transmission parameter and the second transmission parameter have had an associated indication of the implant power parameter returned from the internal portion. In other embodiments, block 212 is performed after a subset of the combinations of the first transmission parameter and the second transmission parameter have had an associated indication of the implant power parameter returned from the internal portion. In still yet other embodiments, block 212 is performed after the first combination of the first transmission parameter and the second transmission parameter is determined to be a preferred set of transmission parameters.

In some embodiments, at block 206, more than one set of transmission parameters is defined as preferred. However, in operation, the prosthesis can only transmit based on one set of transmission parameters at any given time. Thus, at block 212, one of the preferred sets of transmission parameters is selected. Various embodiments may use different methods to determine which set of transmission parameters to use for transmission. For example, in one embodiment, the set of transmission parameters with the lowest power usage is chosen. In another embodiment, the set of transmission parameters with the lowest signal bandwidth is chosen. In yet another embodiment, the set of transmission parameters with the lowest signal amplitude is chosen. In a further embodiment, the set of transmission parameters with the lowest RF power is chosen.

Figure 3:
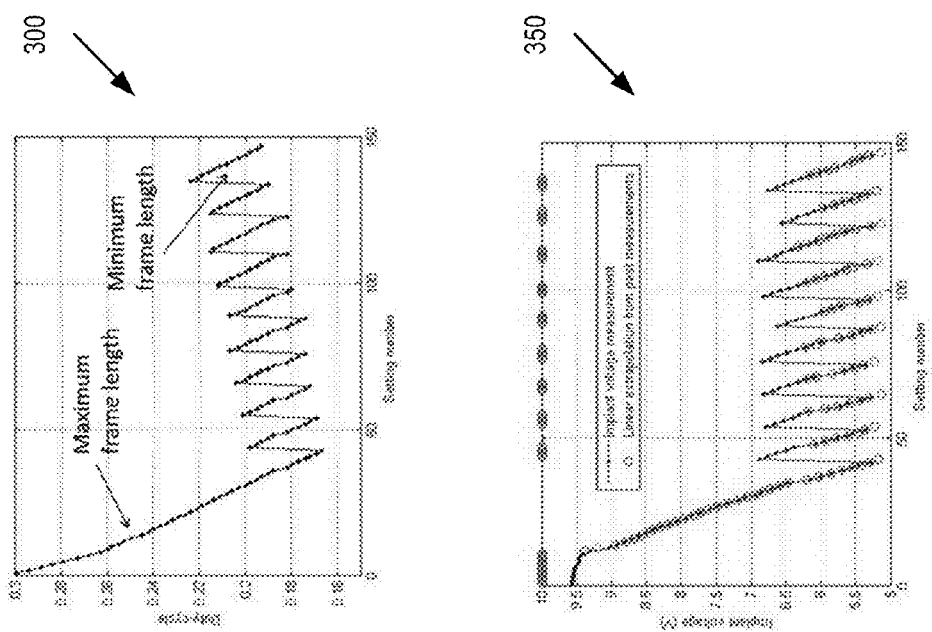
FIG. 3 is a combination of two graphs illustrating a relationship between transmission parameter settings and associated implant power.

FIG. 3 is a combination of two graphs 300 and 350 illustrating a relationship between transmission parameter settings and associated implant power. In one embodiment, the hearing prosthesis system performs method 200 (of FIG. 2) as an initialization algorithm using the parameters as shown in the graph 300 of FIG. 3. Graph 300 shows the progression of RF power levels and frame length settings tested during initialization. Graph 350 shows the associated implant power parameter measurement obtained for each of these corresponding settings.

With respect to graph 300, the x-axis represents a setting number while the y-axis represents the RF power level (i.e. duty cycle) of the transmitted signal. The setting number is incremented with each iteration. The first setting on the left side of the plot corresponds to a maximum frame length and a maximum RF power level. Once the processor is configured for this setting, it transmits a signal to the internal portion with the setting and receives an implant power parameter from the internal portion. In some embodiments, as long as the associated implant power parameter is above the threshold voltage, the RF power level is decremented by a fixed amount.

The corresponding voltage measurements at each setting are shown in Chart 350. As shown in graph 350, at the start of the initialization algorithm, the implant power parameter does not vary significantly with RF power level. In the example shown, the internal portion may have a voltage limiting diode that prevents the voltage from being too high, in order to avoid damaging the circuitry of the internal portion. In graph 350, the voltage limit can be seen as the flat line around 9.5 V. However, once the decrease in the RF power level causes the voltage to fall below the diode voltage, decrementing the RF power level results in a lower implant power parameter.

In some embodiments, in order to ensure that a reduction in RF power level will not cause the implant power parameter to fall out of compliance, a processor (located either in the external portion or in an external computer) first predicts what the implant power parameter will be. This prediction is based on a linear extrapolation of previous measurements and is shown by the circles in graph 350. The close agreement between the predicted red circles and the actual voltage measurements (the line of graph 350) indicates that a simple linear extrapolation may provide a very accurate prediction of implant power parameter. This process of measuring the implant power parameter, predicting the next implant power parameter, and then reducing the RF power level continues until the prediction yields an implant power parameter that is below the threshold voltage.

For the example of graph 350, the threshold voltage is 5.25 V. In this embodiment, the internal portion requires a voltage of 5 V to operate; however, a tolerance of 0.25 volts is included above the operation voltage to ensure the internal portion receives enough power. The first prediction that falls below this level can be seen as the "open" circle (at setting number 41 in graph 350).

In some embodiments, the mathematical prediction is not used. The prosthesis instead attempts to transmit with parameters that cause the voltage to be below the threshold. In such embodiments, the internal portion reports back the implant power parameter. However, if the internal portion is too under-powered, it may not function at all and may fail to return an implant power parameter indication, causing the external portion to record an error, for example.

When it is determined that a set of transmission parameters would result in an implant power parameter that is below the threshold (either from extrapolation or as reported by the internal portion), three things preferably happen. First, the supply current going into the Radio-Frequency Integrated Circuit (RFIC) for the last set of transmission parameters resulting in an implant power parameter greater than the threshold is recorded. This is a potential candidate for the "best" setting since implant power parameters above this typically result in more power consumption owing to the largely constant current nature of the implant load.

Second, the RF power level is incremented by a fixed amount. This can be seen by the increase in the duty-cycle occurring at setting number 42. By increasing the RF power level, the amount of power transmitted is increased. In alternate embodiments, the amount of power transmitted is increased by increasing the power level of the radio signal that conducts the signal. For example, the power may be increased by 1 dB with each iteration.

Finally, the frame length is also reduced. The reason the RF power level is increased before the frame length is decreased is to avoid the possibility that a reduction in frame length results in the implant power parameter falling below the compliance voltage. By decreasing the frame length, each frame will be a shorter amount of time. Because the RF power level was increased (or the power level increased) before the frame was shortened, more power will be transmitted to the internal portion than at the previous step. Hence, implant power parameter increases, as shown at setting number 42 of graph 350.

As shown in graphs 300 and 350, the previously described process, using method 200 of FIG. 2, continues for a plurality of frame lengths and duty-cycles (or power levels). Once the frame length has been lowered to its minimum value, and the various RF power levels have been tested with it, the processor in the prosthesis can then determine which combination of transmission parameters to use for future transmissions. In one embodiment, the processor determines which set of transmission parameters has the lowest overall power usage while still creating an implant power parameter greater than the threshold implant power parameter. In another embodiment, the processor chooses a set of transmission parameters to use for future transmissions based on different criteria.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. A method comprising:
   (i) using a plurality of transmission parameters, transmitting, from an external component of an implantable medical device to an internal component of the implantable medical, a signal, wherein the internal component is implanted in a recipient;
   (ii) receiving at the external component an indication of an implant power parameter correlated to the plurality of transmission parameters;
   (iii) adjusting a first transmission parameter included in the plurality of transmission parameters;
   (iv) adjusting a second transmission parameter included in the plurality of transmission parameters;
   (v) repeating (i) and (ii) after adjusting at least one of the first transmission parameter or the second transmission parameter;
   (vi) based on each received indication of the implant power parameter, determining a preferred set of transmission parameters, wherein the preferred set of transmission parameters includes a setting for the first transmission parameter and a setting for the second transmission parameter; and
   (vii) operating with the preferred set of transmission parameters, wherein, when operating with the preferred set of transmission parameters, a power usage for the external component is less than a threshold power usage.

2. The method of claim 1, wherein the first transmission parameter is one of a power level or a burst length.

3. The method of claim 1, wherein the first transmission parameter is a power level, and wherein the second transmission parameter is a burst length.

4. The method of claim 1, wherein adjusting first transmission parameter comprises iteratively adjusting the first transmission parameter from a first pre-defined set of values.

5. The method of claim 1, wherein adjusting the second transmission parameter comprises iteratively adjusting the second transmission parameter from a pre-defined set of values.

6. The method of claim 4, wherein adjusting the second transmission parameter comprises, for each iterative adjustment of the first transmission parameter, iteratively adjusting the second transmission parameter from a second pre-defined set of values.

7. The method of claim 1, further comprising storing at least one preferred set of transmission parameters.

8. The method of claim 1, wherein, when transmitting based on the preferred set of transmission parameters, the implant power parameter is greater than a threshold implant power parameter.

9. The method of claim 1, wherein (i) and (ii) are performed responsive to receiving an indication of system initiation.

10. An article of manufacture including a non-transitory computer-readable medium having instructions stored thereon that, upon execution by a computing device, cause the computing device to perform operations comprising:
    (i) using a plurality of signal parameters, transmitting a signal to an internal component of an implantable medical device, wherein the internal component is implanted in a recipient;
    (ii) after transmitting the signal, receiving an indication of an implant power parameter correlated to the transmitted signal;
    (iii) adjusting a first signal parameter included in the plurality of signal parameters;
    (iv) adjusting a second signal parameter included in the plurality of signal parameters;
    (v) repeating (i) and (ii) after adjusting at least one of the first signal parameter or the second signal parameter;
    (vi) based on each received indication of the implant power parameter, determining a preferred set of signal parameters, wherein the preferred set of transmission parameters includes a setting for the first transmission parameter and a setting for the second transmission parameter; and
    (vii) communicating with the internal component using the preferred set of signal parameters, wherein, when communicating using the preferred set of signal parameters, a power usage for transmissions to the internal component is less than a threshold power usage.

11. The article of manufacture of claim 10, wherein the first signal parameter is one of a power level or a frame length.

12. The article of manufacture of claim 10, wherein the first signal parameter is a power level, and wherein the second signal parameter is a frame length.

13. The article of manufacture of claim 10, wherein adjusting the first signal parameter comprises iteratively adjusting the first signal parameter from a first pre-defined set of values.

14. The article of manufacture of claim 10, wherein adjusting the second signal parameter comprises iteratively adjusting the second signal parameter from a pre-defined set of values.

15. The article of manufacture of claim 13, wherein adjusting the second signal parameter comprises, for each iteratively adjusted first signal parameter, iteratively adjusting the second signal parameter from a second pre-defined set of values.

16. The article of manufacture of claim 10, further comprising storing at least one preferred set of signal parameters.

17. The article of manufacture of claim 10, wherein (i) and (ii) are performed responsive to detecting a presence of the internal component.

18. The article of manufacture of claim 10, wherein, when communicating based on the preferred set of signal parameters, the implant power parameter is greater than a threshold implant power parameter.

19. An external component of a hearing prosthesis comprising:
- radio electronics configured to (i) using a plurality of signal parameters, transmit a signal to an internal component of the hearing prosthesis, wherein the internal component is implanted in a recipient, (ii) receive an indication of an implant power parameter correlated to the plurality of signal parameters, and (iii) communicate using a preferred set of signal parameters, wherein the preferred set of signal parameters includes a setting for the first signal parameter and a setting for the second signal parameter;
- a processor configured to (iv) adjust at least one of a first signal parameter from the plurality of signal parameters and a second signal parameter from the plurality of signal parameters, (v) cause the radio electronics to repeat (i) and (ii) after adjusting at least one of the first signal parameter or the second signal parameter, and (vi) based on each indication of the implant power parameter received by the radio electronics, determine the preferred set of signal parameters; and
- output electronics for providing a stimulation to a user of the hearing prosthesis, wherein, when the radio electronics communicate using the preferred set of signal parameters, a power usage for the external component is less than a threshold power usage.

20. The hearing prosthesis of claim 19, wherein the first signal parameter is one of a power level or a frame length.

21. The hearing prosthesis of claim 19, wherein the first signal parameter is a power level, and wherein the second signal parameter is a frame length.

22. The hearing prosthesis of claim 19, wherein the processor is configured to adjust the first signal parameter by iteratively adjusting the respective signal parameter from a first pre-defined set of values.

23. The hearing prosthesis of claim 22, wherein, for each iteratively adjusted first signal parameter, the processor is further configured to iteratively adjust the second signal parameter from a second pre-defined set of values.

24. The hearing prosthesis of claim 19, further comprising storing at least one preferred set of signal parameters in a data storage.

25. The hearing prosthesis of claim 19, wherein the radio electronics performs (i) and (ii) responsive to detecting a presence of the internal component.

26. The hearing prosthesis of claim 19, wherein, when the radio electronics communicates based on the preferred set of signal parameters, the implant power parameter is greater than a threshold implant power parameter.

* * * * *